United States Patent
Chisaka

(10) Patent No.: US 9,949,382 B2
(45) Date of Patent: Apr. 17, 2018

(54) METHOD FOR MANUFACTURING RIGID-FLEXIBLE MULTILAYER WIRING BOARD AND COLLECTIVE BOARD

(71) Applicant: Murata Manufacturing Co., Ltd., Nagaokakyo-shi, Kyoto-fu (JP)

(72) Inventor: Shunsuke Chisaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 318 days.

(21) Appl. No.: 14/801,929

(22) Filed: Jul. 17, 2015

(65) Prior Publication Data
US 2015/0327374 A1 Nov. 12, 2015

Related U.S. Application Data

(60) Division of application No. 13/474,755, filed on May 18, 2012, now Pat. No. 9,119,335, which is a continuation of application No. PCT/JP2010/070326, filed on Nov. 16, 2010.

(30) Foreign Application Priority Data

Nov. 20, 2009 (JP) .................. 2009-265276

(51) Int. Cl.
H05K 3/46 (2006.01)

(52) U.S. Cl.
CPC ... *H05K 3/4691* (2013.01); *H05K 2201/0129* (2013.01); *H05K 2201/09127* (2013.01); *H05K 2203/0228* (2013.01); *Y10T 29/49155* (2015.01); *Y10T 156/1052* (2015.01)

(58) Field of Classification Search
CPC ......... H05K 3/4691; H05K 2203/0228; H05K 2201/0129; H05K 2201/09127; Y10T 156/1052
See application file for complete search history.

(56) References Cited

FOREIGN PATENT DOCUMENTS

JP        200834433      *  2/2008

OTHER PUBLICATIONS

Shibue; Machine Translation of JP 2008034433. Feb. 14, 2008.*
Chisaka, "Method for Manufacturing Rigid-Flexible Multilayer Wiring Board and Collective Board", U.S. Appl. No. 13/474,755, filed May 18, 2012.

* cited by examiner

*Primary Examiner* — Mark A Osele
*Assistant Examiner* — Christopher C Caillouet
(74) *Attorney, Agent, or Firm* — Keating & Bennett, LLP

(57) ABSTRACT

A method for manufacturing a rigid-flexible multilayer wiring board includes a step of forming a release layer such that the release layer covers a flexible portion forming region of a principal surface of a first thermoplastic resin sheet, a step of conducting surface modification on the principal surface of the first thermoplastic resin sheet while using the release layer as a mask, a step of laminating a second thermoplastic resin sheet such that the second thermoplastic resin sheet covers the release layer to form a laminate including the first and second thermoplastic resin sheets, a step of press-bonding the laminate, a step of forming a cut from at least either one of upper and lower surfaces of the laminate toward an outline of the release layer when seen in a plan view, and a step of removing a portion surrounded by the cut.

2 Claims, 15 Drawing Sheets

FIRST CLOSED LOOP

SECOND CLOSED LOOP

METHOD FOR MANUFACTURING RIGID-FLEXIBLE MULTILAYER WIRING BOARD AND COLLECTIVE BOARD

BACKGROUND OF THE INVENTION

1. Field of the Invention

The present invention relates to a method for manufacturing a rigid-flexible multilayer wiring board and a collective board.

2. Description of the Related Art

A rigid-flexible multilayer wiring board is used when various wires are drawn around within a housing of a mobile communication terminal, a digital compact camera, or the like. The "rigid-flexible multilayer wiring board" is a multilayer wiring board which includes a rigid portion and a flexible portion. Each of the rigid portion and the flexible portion is formed so as to include a resin layer. Thus, the rigid-flexible multilayer wiring board is a kind of a resin multilayer board. The flexible portion has higher flexibility than the rigid portion. A chip capacitor, a semiconductor IC element, a connector, and the like are mounted on or included in the rigid portion, and circuit elements such as a ground electrode, a capacitor electrode, and an inductor electrode are included in these components. By bending the flexible portion, various wires are three-dimensionally drawn around within the housing. In view of this requirement, the flexible portion is preferably as thin as possible.

A rigid-flexible multilayer wiring board and its manufacturing method are generally a structure and a manufacturing method as described in Japanese Unexamined Patent Application Publication No. 10-200258. In other words, base materials which are previously formed into predetermined shapes are laminated and press-bonded, thereby producing a rigid-flexible multilayer wiring board which includes a thick rigid portion and a relatively thin flexible portion. In this case, press-bonding is difficult. This is because it is difficult to uniformly apply pressure to a laminate having regions with different thicknesses. For example, if the pressure is too low, press-bonding is insufficient and delamination occurs. On the other hand, if the pressure is too high, a thick portion becomes deformed.

As a countermeasure, for example, a structure and a manufacturing method as described in Japanese Unexamined Patent Application Publication No. 2008-34433 are known. In the manufacturing method, plate-shaped base materials are laminated and press-bonded, and a laser beam is applied to a region which is to be a flexible portion. In the region which is to be the flexible portion, an unnecessary portion is entirely removed by the laser beam, and the region becomes thin, whereby the region becomes the flexible portion. However, in the manufacturing method, since the entire unnecessary portion is removed by the laser beam, this removal operation takes time. In addition, due to the laser beam being reflected by copper foil and incident on an undesired portion, a portion which is to be left in a final product may be damaged.

SUMMARY OF THE INVENTION

Preferred embodiments of the present invention provide a method for manufacturing a rigid-flexible multilayer wiring board and a collective board which allow an operation to remove an unnecessary portion for forming a flexible portion to be conducted in a short time.

A method for manufacturing a rigid-flexible multilayer wiring board according to a preferred embodiment of the present invention includes a step of forming a release layer from a resin material having a higher melting point than that of a material of a first thermoplastic resin sheet, such that the release layer covers a flexible portion forming region of a principal surface of the first thermoplastic resin sheet; a step of conducting surface modification on the principal surface of the first thermoplastic resin sheet while using the release layer as a mask; a step of laminating a second thermoplastic resin sheet on the principal surface of the first thermoplastic resin sheet such that the second thermoplastic resin sheet covers the release layer, to form a laminate including the first and second thermoplastic resin sheets; a step of press-bonding the laminate; a step of forming a cut from at least either one of upper and lower surfaces of the laminate toward an outline of the release layer when seen in a plan view; and a step of removing a portion surrounded by the cut.

According to a preferred embodiment of the present invention, in removing an unnecessary portion for forming a flexible portion, a portion surrounded by the cut can easily be removed by using the function of the release layer. Thus, an operation to remove the unnecessary portion for forming the flexible portion can be conducted in a short time.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred Embodiment 1

Figure 1:
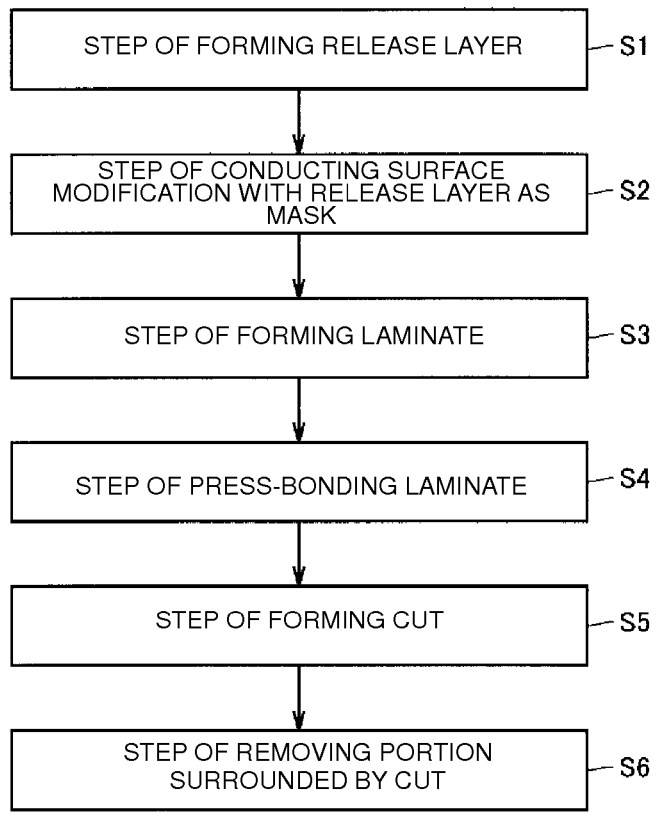
FIG. 1 is a flowchart of a method for manufacturing a rigid-flexible multilayer wiring board according to Preferred Embodiment 1 of the present invention.

A method for manufacturing a rigid-flexible multilayer wiring board according to Preferred Embodiment 1 of the present invention will be described with reference to FIGS. 1 to 9. A flowchart of the manufacturing method is shown in FIG. 1. The method for manufacturing a rigid-flexible multilayer wiring board according to the present preferred embodiment preferably includes: a step S1 of forming a release layer from a resin material having a higher melting point than that of a material of a first thermoplastic resin sheet, such that the release layer covers a flexible portion forming region of a principal surface of the first thermoplastic resin sheet; a step S2 of conducting surface modification on the principal surface of the first thermoplastic resin sheet while using the release layer as a mask; a step S3 of laminating a second thermoplastic resin sheet on the principal surface of the first thermoplastic resin sheet such that the second thermoplastic resin sheet covers the release layer, to form a laminate including the first and second thermoplastic resin sheets; a step S4 of press-bonding the laminate; a step S5 of forming a cut from at least either one of upper and lower surfaces of the laminate toward an outline of the release layer when seen in a plan view; and a step S6 of removing a portion surrounded by the cut.

The manufacturing method will be described in detail below.

First, a commercially available thermoplastic resin film in which conductive foil is laminated on one surface thereof is prepared. The resin portion of the thermoplastic resin film may preferably be a liquid crystal polymer (LCP) resin, a polyether ether ketone (PEEK) resin, or a polyphenylene sulfide (PPS) resin, for example. The conductive foil portion may be not only copper, but also silver, aluminum, or gold, and may be an alloy of these metals, for example. Patterning is conducted on the thermoplastic resin film with the conductive foil on the one surface, by using a known circuit forming method such as photolithography, for example. By this patterning, a connection pad and a circuit wiring layer are formed.

Figure 2:
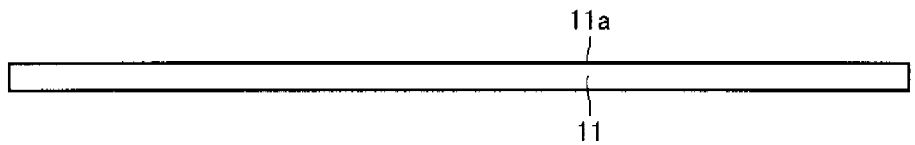
FIG. 2 is a cross-sectional view of a thermoplastic resin film used in the method for manufacturing a rigid-flexible multilayer wiring board according to Preferred Embodiment 1 of the present invention.

The thermoplastic resin film which has been processed so far is shown in FIG. 2. The thermoplastic resin film is a first thermoplastic resin sheet 11. The first thermoplastic resin sheet 11 includes a principal surface 11a. A wiring pattern is actually formed on the principal surface 11a of the first thermoplastic resin sheet 11, although illustration of the wiring pattern is omitted in FIG. 2.

Figure 3:
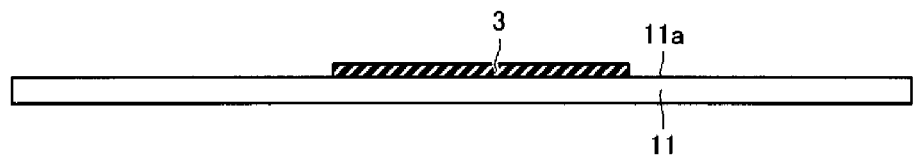
FIG. 3 is a first explanatory diagram of the method for manufacturing a rigid-flexible multilayer wiring board according to Preferred Embodiment 1 of the present invention.

As shown in FIG. 3, as the step S1, a release layer 3 is formed from a resin material having a higher melting point than that of the material of the first thermoplastic resin sheet 11, so as to cover a flexible portion forming region of the principal surface 11a of the first thermoplastic resin sheet 11.

Figure 4:
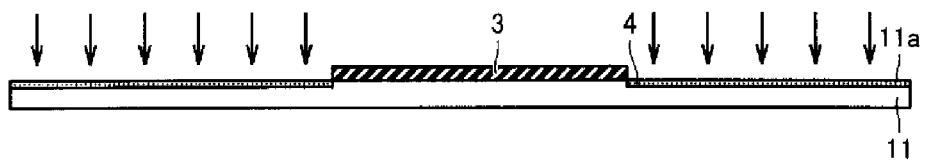
FIG. 4 is a second explanatory diagram of the method for manufacturing a rigid-flexible multilayer wiring board according to Preferred Embodiment 1 of the present invention.

As shown in FIG. 4, as the step S2, surface modification is conducted on the principal surface 11a of the first thermoplastic resin sheet 11 while using the release layer 3 as a mask. The surface modification may be, for example, UV irradiation, plasma treatment, and chemical solution treatment. The surface modification may be, for example, treatment with $O_2$ plasma. By the surface modification, an activated surface 4 is formed. By physically or chemically modifying the surface, adhesiveness of a lamination interface can be provided, and the resin near the pattern can be softened, in other words, the glass transition point and the melting point can be decreased, to embed the wiring pattern formed on the surface of the thermoplastic resin sheet. As a result, embeddability can be improved.

Figure 5:
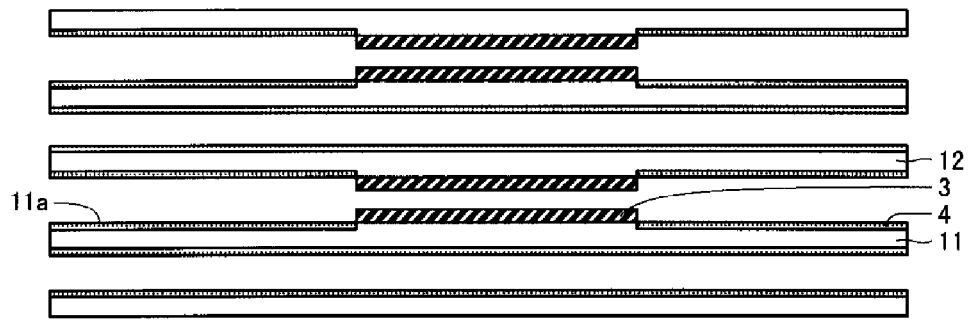
FIG. 5 is a third explanatory diagram of the method for manufacturing a rigid-flexible multilayer wiring board according to Preferred Embodiment 1 of the present invention.
Figure 6:
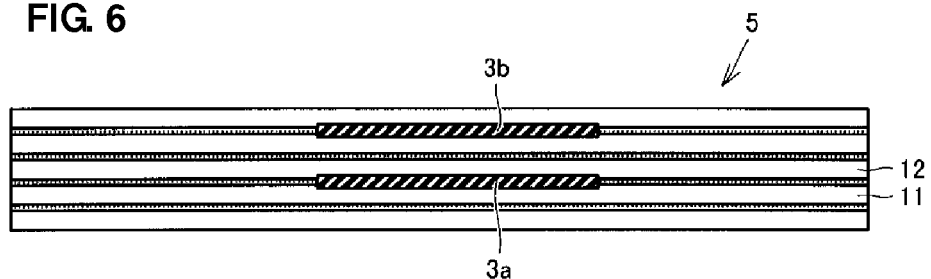
FIG. 6 is a fourth explanatory diagram of the method for manufacturing a rigid-flexible multilayer wiring board according to Preferred Embodiment 1 of the present invention.

As shown in FIG. 5, as the step S3, a second thermoplastic resin sheet 12 is laminated on the principal surface 11a of the first thermoplastic resin sheet 11 so as to cover the release layer 3, to form a laminate including the first and second thermoplastic resin sheets 11 and 12. In the example shown in FIG. 5, a release layer is additionally formed on the second thermoplastic resin sheet 12, but no release layer may be formed on the second thermoplastic resin sheet 12. In addition, the press-bonded surfaces of the thermoplastic resin sheets which face each other are preferably subjected to surface modification, but either one of the press-bonded surfaces may not be subjected to surface modification. In the example shown in FIG. 5, five thermoplastic resin sheets including the first and second thermoplastic resin sheets 11 and 12 preferably are to be laminated, but the number of thermoplastic resin sheets to be laminated is not limited thereto. Moreover, each thermoplastic resin sheet is laminated in a direction such that the wiring patterns do not overlap each other. By the lamination process, a laminate 5 shown in FIG. 6 is formed. The laminate 5 includes release layers 3a and 3b.

Figure 7:
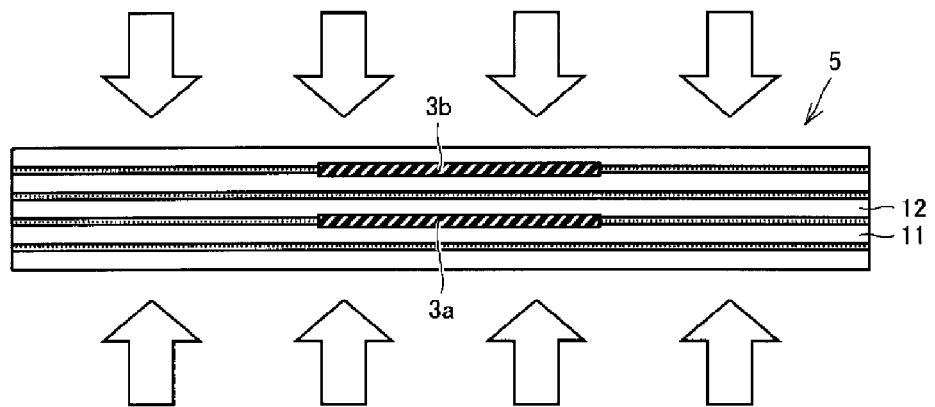
FIG. 7 is a fifth explanatory diagram of the method for manufacturing a rigid-flexible multilayer wiring board according to Preferred Embodiment 1 of the present invention.

As shown in FIG. 7, as the step S4, the laminate 5 is press-bonded.

Figure 8:
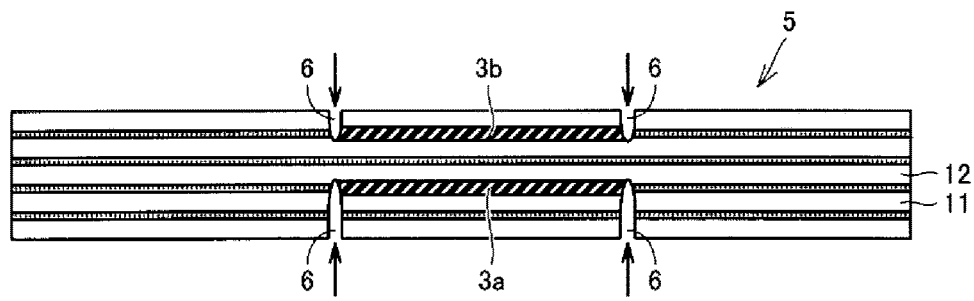
FIG. 8 is a sixth explanatory diagram of the method for manufacturing a rigid-flexible multilayer wiring board according to Preferred Embodiment 1 of the present invention.

As shown in FIG. 8, as the step S5, a cut 6 is formed from at least either one of upper and lower surfaces of the laminate 5 toward an outline of the release layer when seen in a plan view. In the example shown in FIG. 8, cuts 6 are formed from both the upper and lower surfaces of the laminate 5 toward the outlines of the release layers 3a and 3b when seen in a plan view. In FIG. 8 which is a cross-sectional view, it appears that the cuts 6 are formed at positions corresponding to both ends of the release layers 3a and 3b. Various methods are considered as a method for forming the cuts 6, and, for example, the cuts 6 can be formed by irradiation with a laser beam.

Figure 9:
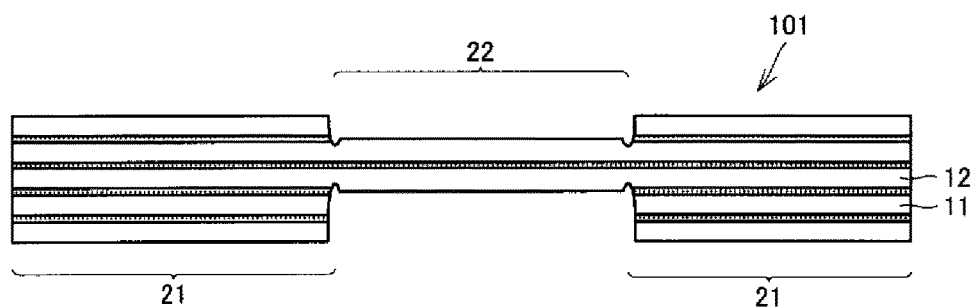
FIG. 9 is a cross-sectional view of a rigid-flexible multilayer wiring board obtained by the method for manufacturing a rigid-flexible multilayer wiring board according to Preferred Embodiment 1 or 2 of the present invention.

As the step S6, portions surrounded by the cuts 6 are removed. In the portions surrounded by the cuts 6, the release layers 3a and 3b extend. The upper and lower thermoplastic resin sheets which are in contact with each other via each of the release layers 3a and 3b but not adhered with each other are in a state of being easily separated from each other. Thus, the portions surrounded by the cuts 6 can be easily removed. In this manner, a structure shown in FIG. 9 is obtained. In other words, a rigid-flexible multilayer wiring board 101 can be obtained. The rigid-flexible multilayer wiring board 101 includes rigid portions 21 and a flexible portion 22. A portion left by removing the portions surrounded by the cuts 6 becomes the flexible portion 22.

In this preferred embodiment, as described above, in removing the unnecessary portions for forming the flexible portion in the step S6, the portions surrounded by the cuts 6 can be easily removed by using the functions of the release layers 3a and 3b. Thus, the operation to remove the unnecessary portions for forming the flexible portion can be conducted easily and in a short time.

Preferred Embodiment 2

Figure 10:
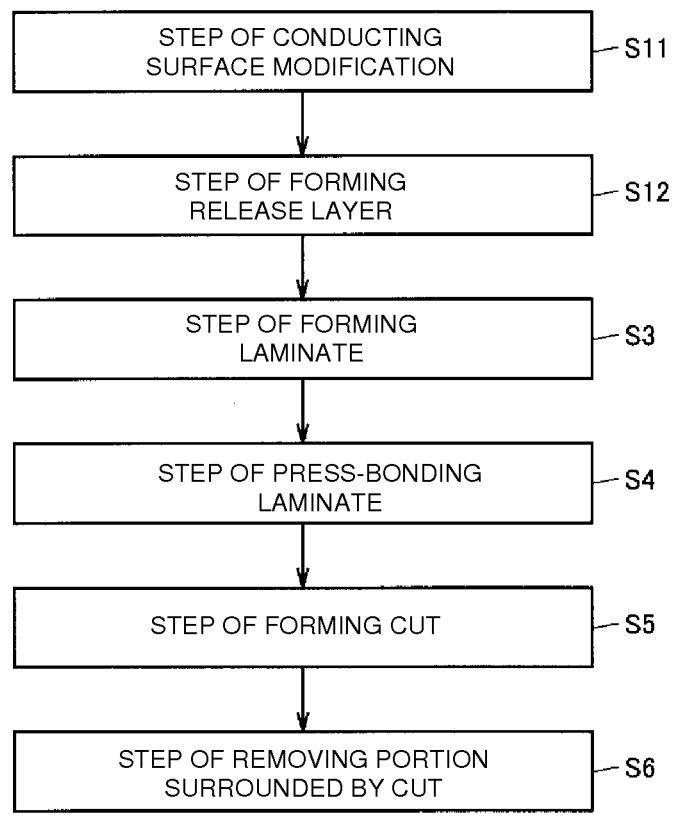
FIG. 10 is a flowchart of the method for manufacturing a rigid-flexible multilayer wiring board according to Preferred Embodiment 2 of the present invention.

A method for manufacturing a rigid-flexible multilayer wiring board according to Preferred Embodiment 2 of the present invention will be described with reference to FIGS. 10 to 13. A flowchart of this manufacturing method is shown in FIG. 10. The method for manufacturing a rigid-flexible multilayer wiring board according to the present preferred embodiment preferably includes a step S11 of conducting surface modification on a principal surface of a first thermoplastic resin sheet; a step S12 of forming a release layer from a resin material having a higher melting point than that of a material of the first thermoplastic resin sheet, such that the release layer covers a flexible portion forming region of the principal surface of the first thermoplastic resin sheet on which the surface modification has been conducted; a step S3 of laminating a second thermoplastic resin sheet on the principal surface of the first thermoplastic resin sheet such that the second thermoplastic resin sheet covers the release layer, to form a laminate including the first and second thermoplastic resin sheets; a step S4 of press-bonding the laminate; a step S5 of forming a cut from at least either one of upper and lower surfaces of the laminate toward an outline of the release layer when seen in a plan view; and a step S6 of removing a portion surrounded by the cut.

This manufacturing method will be described in detail below. The method until a thermoplastic resin film is prepared is preferably the same as that described in Preferred Embodiment 1. In other words, the first thermoplastic resin sheet 11 is prepared as shown in FIG. 2.

Figure 11:
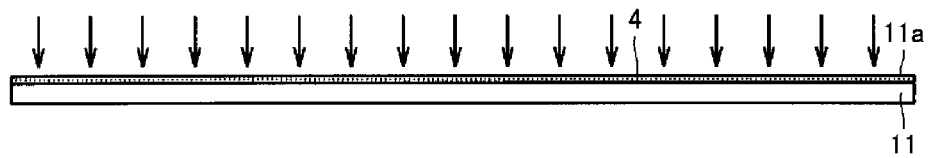
FIG. 11 is a first explanatory diagram of the method for manufacturing a rigid-flexible multilayer wiring board according to Preferred Embodiment 2 of the present invention.

As shown in FIG. 11, as the step S11, surface modification is conducted on the principal surface 11a of the first thermoplastic resin sheet 11. The surface modification may be, for example, UV irradiation, plasma treatment, and chemical solution treatment. The surface modification may be, for example, treatment with $O_2$ plasma. By the surface modification, the activated surface 4 is formed.

Figure 12:
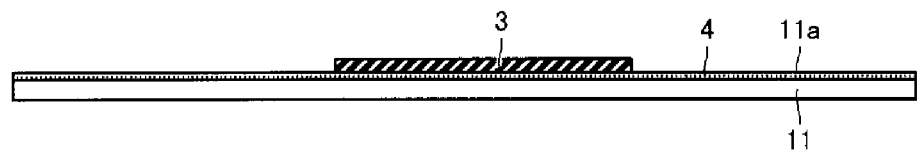
FIG. 12 is a second explanatory diagram of the method for manufacturing a rigid-flexible multilayer wiring board according to Preferred Embodiment 2 of the present invention.

As shown in FIG. 12, as the step S12, the release layer 3 is formed from a resin material having a higher melting point than that of the material of the first thermoplastic resin sheet 11, so as to cover the flexible portion forming region of the principal surface 11a of the first thermoplastic resin sheet 11 on which the surface modification has been conducted.

Figure 13:
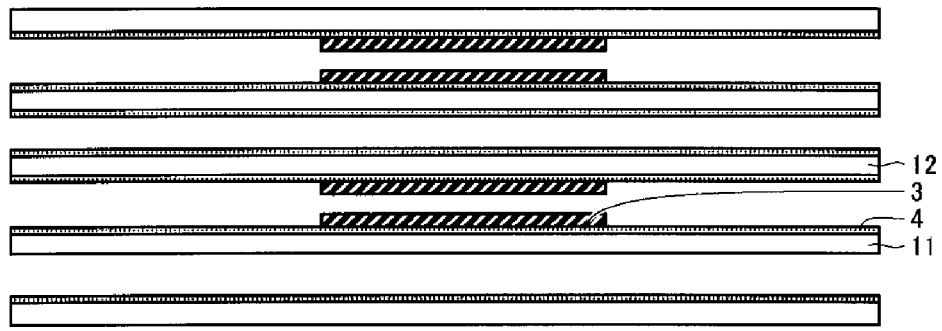
FIG. 13 is a third explanatory diagram of the method for manufacturing the rigid-flexible multilayer wiring board according to Preferred Embodiment 2 of the present invention.

As shown in FIG. 13, as the step S3, the second thermoplastic resin sheet 12 is laminated on the principal surface 11a of the first thermoplastic resin sheet 11 so as to cover the release layer 3, to form a laminate including the first and second thermoplastic resin sheets 11 and 12. The details of the step S3 are as described regarding the step S3 in Preferred Embodiment 1.

The details of each of subsequent processes, namely, the step S4 of press-bonding the laminate 5, the step S5 of forming the cuts 6, and the step S6 of removing the portions surrounded by the cuts 6, are as described in Preferred Embodiment 1. In this manner, the structure shown in FIG.

9 is finally obtained. In other words, the rigid-flexible multilayer wiring board 101 can be obtained. The details of the rigid-flexible multilayer wiring board 101 are as described in Preferred Embodiment 1.

In the present preferred embodiment, the same advantageous effects as those of Preferred Embodiment 1 can be obtained. In other words, in removing the unnecessary portion for forming the flexible portion in the step S6, the portions surrounded by the cuts 6 can be easily removed by using the functions of the release layers. Thus, the operation to remove the unnecessary portion for forming the flexible portion can be conducted in a short time.

It should be noted that in Preferred Embodiments 1 and 2, the step S5 of forming the cut is preferably conducted by irradiation with a laser beam. This is because the laser beam is easily controlled. The laser beam applied in this case may be, for example, a carbon dioxide laser or a UV laser.

It should be noted that in Preferred Embodiments 1 and 2, in the step S5 of forming the cut, the cut is preferably formed at such a depth that the cut enters a portion of a thermoplastic resin sheet which is to be left even after the removing process. In FIG. 8, each cut 6 is formed at such a depth that the cut 6 enters a portion of the thermoplastic resin sheet which is to be left even after the removing process. When the cut is formed at such a depth, the unnecessary portion which is to be removed can assuredly be separated from the other portion, and thus assured removal can easily be conducted in the process of removing the unnecessary portion.

It should be noted that in Preferred Embodiments 1 and 2, as the material of the release layer, a resin material having higher viscoelasticity near a press-bonding temperature than that of the material of the first thermoplastic resin sheet 11 is preferably used. If the viscoelasticity of the material of the release layer near the press-bonding temperature is lower than that of the material of the first thermoplastic resin sheet 11, a portion of the release layer 3 may protrude from the laminated position and drop into the cut 6 provided in the step S5. However, since the resin material having higher viscoelasticity near the press-bonding temperature than that of the material of the first thermoplastic resin sheet 11 is preferably used as the material of the release layer 3, such a situation can be prevented.

It should be noted that in Preferred Embodiments 1 and 2, it is preferred that each of the materials of the first and second thermoplastic resin sheets is a liquid crystal polymer and the material of the release layer is polyimide. This is because these materials are easily available and easily processed.

Preferred Embodiment 3

Figure 14:
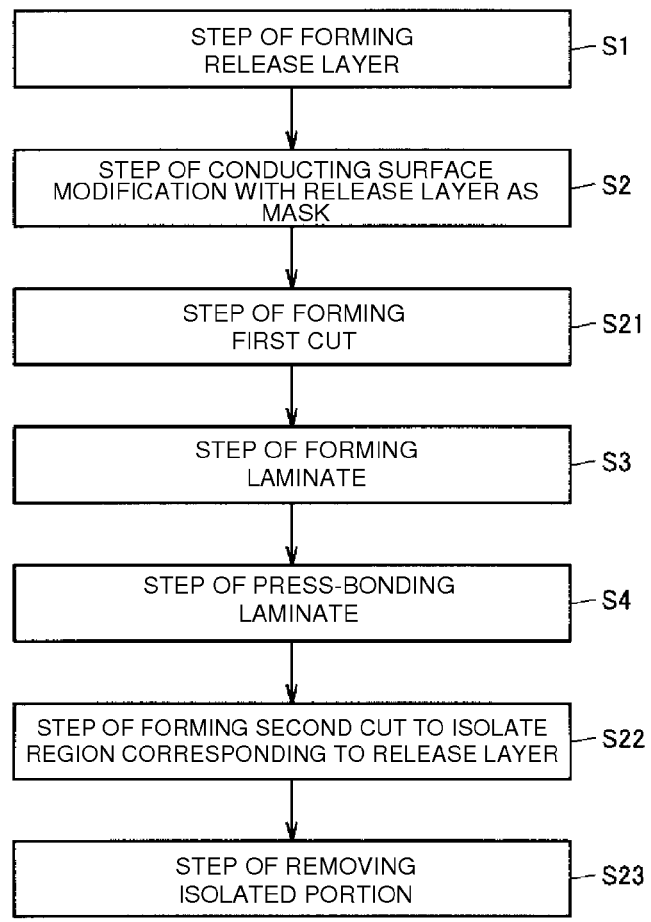
FIG. 14 is a flowchart of a method for manufacturing a rigid-flexible multilayer wiring board according to Preferred Embodiment 3 of the present invention.

A method for manufacturing a rigid-flexible multilayer wiring board according to Preferred Embodiment 3 of the present invention will be described with reference to FIGS. 14 to 22. A flowchart of this manufacturing method is shown in FIG. 14. The method for manufacturing a rigid-flexible multilayer wiring board according to the present preferred embodiment preferably includes a step S1 of forming a release layer from a resin material having a higher melting point than that of a material of a first thermoplastic resin sheet, such that the release layer covers a flexible portion forming region of a principal surface of the first thermoplastic resin sheet; a step S2 of conducting surface modification on the principal surface of the first thermoplastic resin sheet with the release layer as a mask; a step S21 of forming a first cut in the first thermoplastic resin sheet and the release layer such that the first cut separates the first thermoplastic resin sheet and the release layer entirely in a thickness direction along a portion of an outline of the release layer when seen in a plan view; a step S3 of laminating a second thermoplastic resin sheet on the principal surface of the first thermoplastic resin sheet such that the second thermoplastic resin sheet covers the release layer, to form a laminate including the first and second thermoplastic resin sheets; a step S4 of press-bonding the laminate; a step S22 of forming a second cut from at least either one of upper and lower surfaces of the laminate such that the first cut is combined with the second cut so as to form a closed loop shape to isolate a region of the first or second thermoplastic resin sheet being face-to-face with the release layer; and a step S23 of removing a portion of the first or second thermoplastic resin sheet which is isolated by the isolating step S22.

Figure 15:
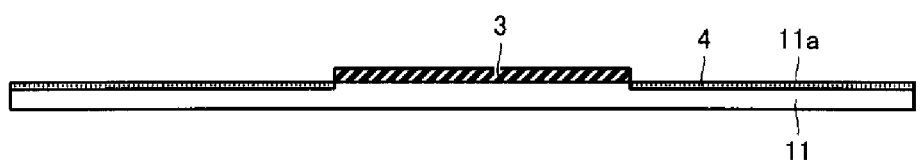
FIG. 15 is a first explanatory diagram of the method for manufacturing a rigid-flexible multilayer wiring board according to Preferred Embodiment 3 of the present invention.

This manufacturing method will be described in detail below. The details to the step S2 in FIG. 14 preferably are the same as those described in Preferred Embodiment 1. Thus, by conducting the steps to the step S2, the first thermoplastic resin sheet 11 in a state shown in FIG. 15 is obtained.

Figure 16:
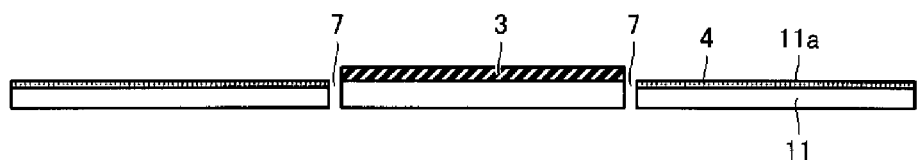
FIG. 16 is a second explanatory diagram of the method for manufacturing a rigid-flexible multilayer wiring board according to Preferred Embodiment 3 of the present invention.

As shown in FIG. 16, as the step S21, first cuts 7 are formed. The first cuts 7 separate the first thermoplastic resin sheet 11 and the release layer 3 entirely in a thickness direction along portions of an outline of the release layer 3 when seen in a plan view. The first cuts 7 separates the first thermoplastic resin sheet 11 and the release layer 3 entirely in the thickness direction along the portions of the outline, and do not separate the first thermoplastic resin sheet 11 and the release layer 3 along the entirety of the outline. Thus, even when being separated as shown in FIG. 16, no portion falls off.

Figure 17:
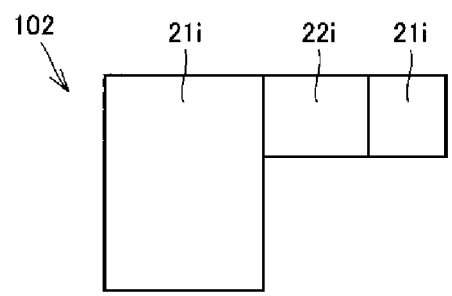
FIG. 17 is a plan view of a rigid-flexible multilayer wiring board illustrated for explaining the method for manufacturing a rigid-flexible multilayer wiring board according to Preferred Embodiment 3 of the present invention.
Figure 18:
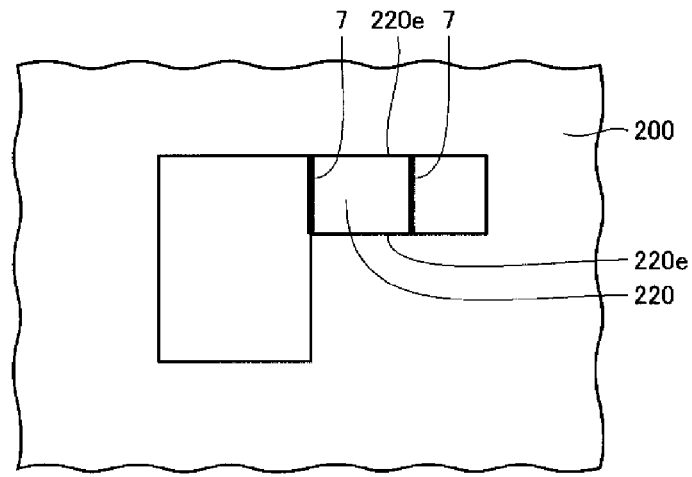
FIG. 18 is a first explanatory diagram of the method for manufacturing a rigid-flexible multilayer wiring board according to Preferred Embodiment 3 of the present invention.

To give a more specific description, for example, a case of obtaining a rigid-flexible multilayer wiring board 102 as shown in a plan view in FIG. 17 is considered. The rigid-flexible multilayer wiring board 102 includes rigid portions 21i and a flexible portion 22i. In this case, at a stage of a single layer of a thermoplastic resin sheet before laminating, it is considered that the first cuts 7 are formed as shown by thick lines in FIG. 18 to provide separation only at these sides. In FIG. 18, the entirety of a portion which is to be the rigid-flexible multilayer wiring board 102 is formed in a large-size sheet 200. The entirety of the portion which is to be the rigid-flexible multilayer wiring board 102 is finally cut out from the sheet 200 by a method such as punching. During the manufacturing process, even when the first cuts 7 provide separation entirely in the thickness direction at these sides, portions 210 which are to be the rigid portions 21i are supported by the sheet 200 at the sides other than the first cuts 7, and a portion 220 which is to be the flexible portion 22i is supported by the sheet 200 at sides 220e. Thus, even when the first cuts 7 are formed, no portion falls off.

Figure 19:
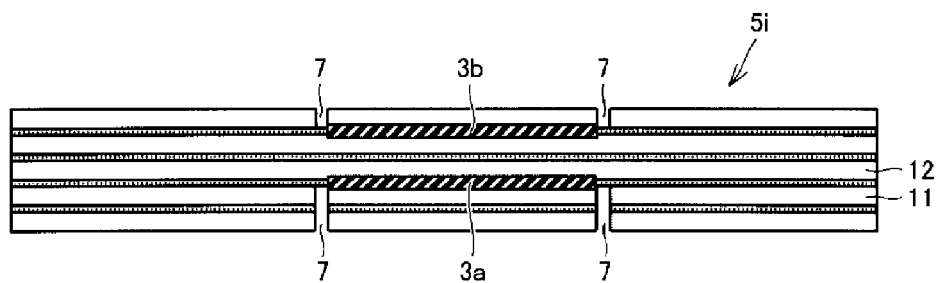
FIG. 19 is a second explanatory diagram of the method for manufacturing a rigid-flexible multilayer wiring board according to Preferred Embodiment 3 of the present invention.

Then, the step S3 of forming the laminate is conducted. The details thereof are basically the same as those described in Preferred Embodiment 1. However, in the present preferred embodiment, at lamination, sheets 200 with first cuts 7 and sheets 200 without any first cuts 7 are laminated. By so doing, a laminate 5i shown in FIG. 19 is obtained.

Figure 20:
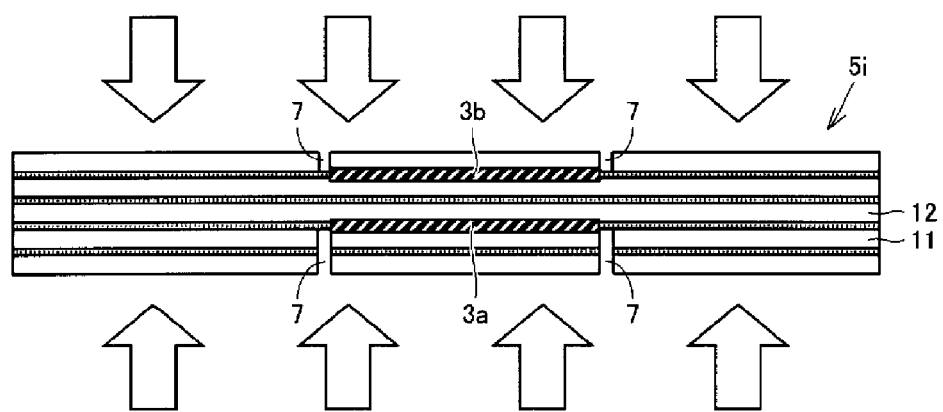
FIG. 20 is a third explanatory diagram of the method for manufacturing a rigid-flexible multilayer wiring board according to Preferred Embodiment 3 of the present invention.
Figure 21:
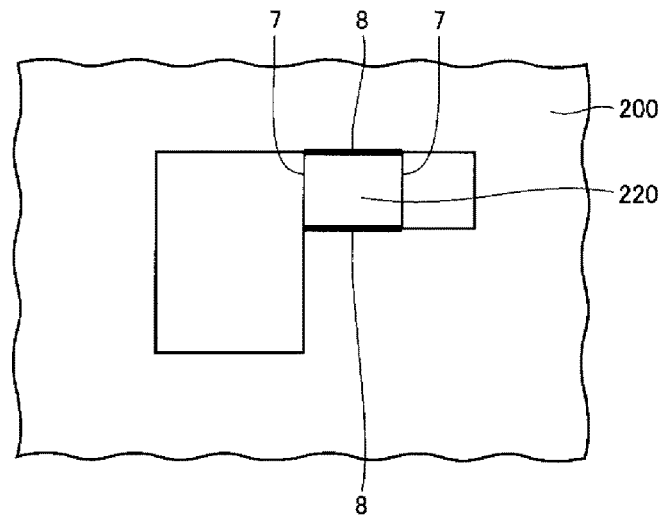
FIG. 21 is a fourth explanatory diagram of the method for manufacturing a rigid-flexible multilayer wiring board according to Preferred Embodiment 3 of the present invention.
Figure 22:
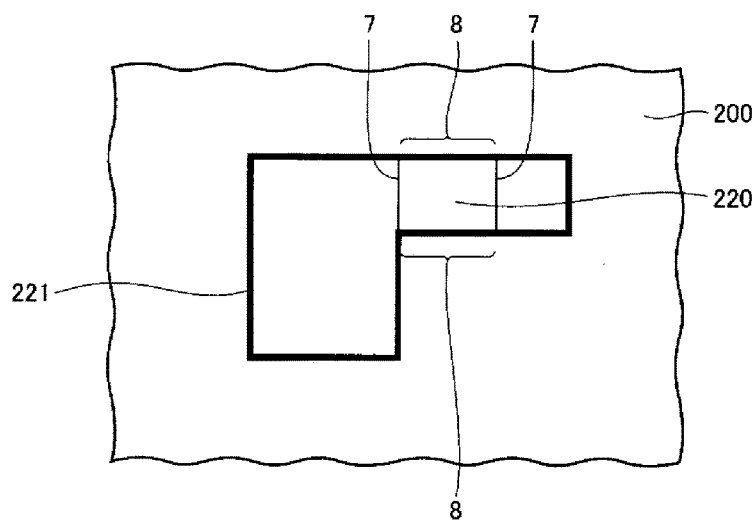
FIG. 22 is a fifth explanatory diagram of the method for manufacturing a rigid-flexible multilayer wiring board according to Preferred Embodiment 3 of the present invention.

As shown in FIG. 20, as the step S4, the laminate 5i is press-bonded.

Next, the step S22 is conducted. In the step S22, as shown by thick lines in FIG. 21, second cuts 8 are formed from at least either one of upper and lower surfaces of the laminate such that the first cuts 7 are combined with the second cuts 8 so as to form a closed loop shape, thereby isolating a region of the first or second thermoplastic resin sheet being face-to-face with the release layer. A portion 220 is the region being face-to-face with the release layer. In forming the second cuts 8, cuts may not be formed only at the sections shown by the thick lines in FIG. 21, and the entirety of the portion which is to be the rigid-flexible multilayer wiring board 102 may be punched out simultaneously. In this case, an outline 221 of the region which is to be the rigid-flexible multilayer wiring board 102 is punched out at the same time as shown by a thick line in FIG. 22. The second cuts 8 are portions of the punched outline 221.

Figure 23:
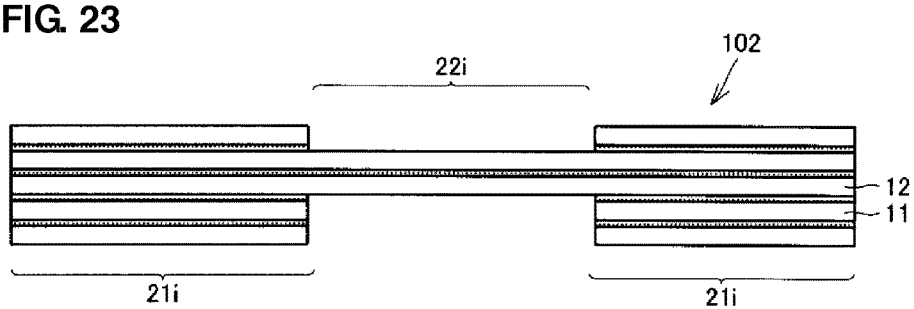
FIG. 23 is a cross-sectional view of a rigid-flexible multilayer wiring board obtained by the method for manufacturing a rigid-flexible multilayer wiring board according to Preferred Embodiment 3 of the present invention.

Next, the step S23 is conducted. In the step S23, the portion of the first thermoplastic resin sheet 11 or the second thermoplastic resin sheet 12 which is isolated by the isolating step S22 is removed. As a result of conducting the step S23, a structure shown in FIG. 23 is obtained. In other words, the rigid-flexible multilayer wiring board 102 can be obtained.

In the present preferred embodiment, the advantageous effects as those of Preferred Embodiments 1 and 2 can be obtained. In other words, in removing the unnecessary portion for forming the flexible portion in the step S23, the portions surrounded by the first cuts 7 and the second cuts 8 can easily be removed by using the function of the release layer. Thus, the operation to remove the unnecessary portion for forming the flexible portion can be conducted easily and in a short time.

Further, in this preferred embodiment, separation is provided at the sides which are to be the boundaries between the rigid portions and the flexible portion, prior to lamination. Thus, it is unnecessary to form cuts at the sides after the lamination. Therefore, a defect does not occur that in forming cuts to a middle position in the thickness direction at the sides after the lamination, the cuts are formed at a depth more than necessary. In this respect, the present preferred embodiment is more preferred.

Figure 24:
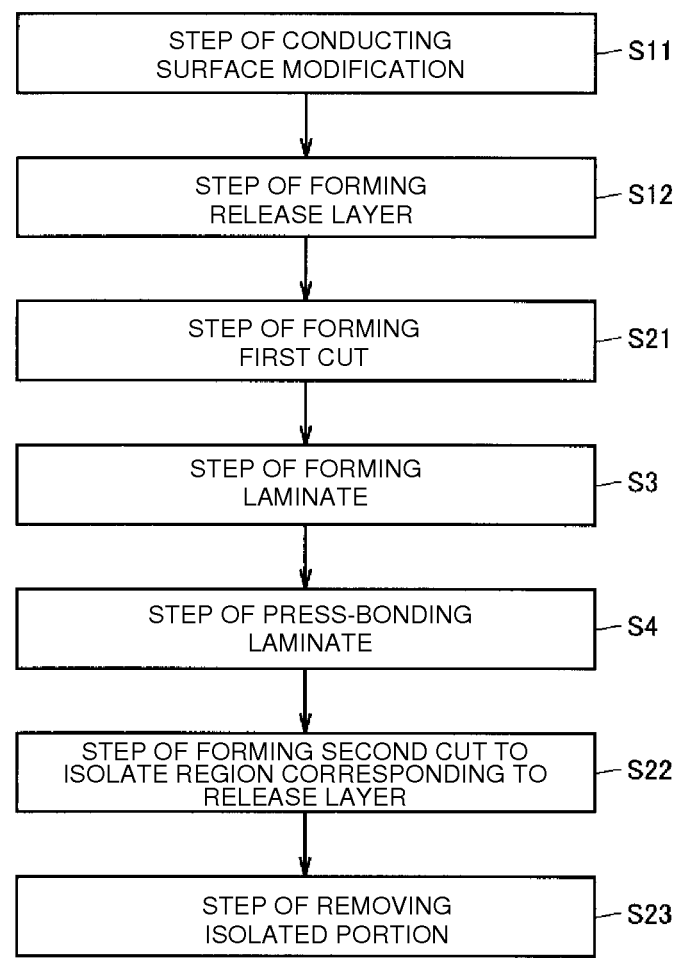
FIG. 24 is a flowchart of a modified example of the method for manufacturing a rigid-flexible multilayer wiring board according to Preferred Embodiment 3 of the present invention.

In the present preferred embodiment, the example where the release layer is formed on the sheet and then the surface modification is conducted has been described. However, the surface modification may be conducted on the sheet, and then the release layer may be formed. A flowchart of a method for manufacturing a rigid-flexible multilayer wiring board in this case is shown in FIG. 24. This is a modified example of the method for manufacturing a rigid-flexible multilayer wiring board according to the present preferred embodiment. The method for manufacturing a rigid-flexible multilayer wiring board as this modified example preferably includes a step S11 of conducting surface modification on a principal surface of a first thermoplastic resin sheet; a step S12 of forming a release layer from a resin material having a higher melting point than that of a material of the first thermoplastic resin sheet, such that the release layer covers a flexible portion forming region of the principal surface of the first thermoplastic resin sheet on which the surface modification has been conducted; a step S21 of forming a first cut in the first thermoplastic resin sheet and the release layer such that the first cut separates the first thermoplastic resin sheet and the release layer entirely in a thickness direction along a portion of an outline of the release layer when seen in a plan view; a step S3 of laminating a second thermoplastic resin sheet on the principal surface of the first thermoplastic resin sheet such that the second thermoplastic resin sheet covers the release layer, to form a laminate including the first and second thermoplastic resin sheets; a step S4 of press-bonding the laminate; a step S22 of forming a second cut from at least either one of upper and lower surfaces of the laminate such that the first cut is combined with the second cut so as to form a closed loop shape to isolate a region of the first or second thermoplastic resin sheet being face-to-face with the release layer; and a step S23 of removing a portion of the first or second thermoplastic resin sheet which is isolated by the isolating step S22.

Even when the surface modification is conducted prior to forming the release layer as in this modified example, the same advantageous effects can be obtained.

Preferred Embodiment 4

Figure 25:
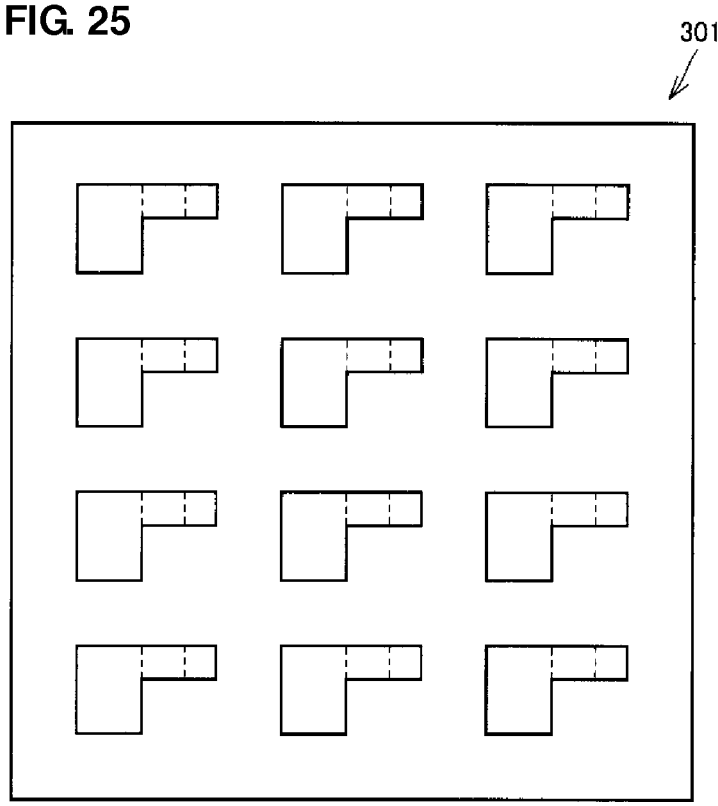
FIG. 25 is a plan view of a collective board according to Preferred Embodiment 4 of the present invention.

A collective board according to Preferred Embodiment 4 of the present invention will be described with reference to FIGS. 25 to 31. A plan view of the entirety of the collective board is shown in FIG. 25. The collective board 301 is, as an example, a collective board which includes 12 rigid-flexible multilayer wiring boards which can be taken out. Here, the total number preferably is 12 as 3×4, for example, but the arrangement and the total number are not limited thereto. The total number may be more or less. In addition, the arrangement of the respective rigid-flexible multilayer wiring boards in the collective board is not limited to the arrangement in which the respective rigid-flexible multilayer wiring boards are disposed in the same orientation, and arrangements in different orientations may be combined.

Figure 26:
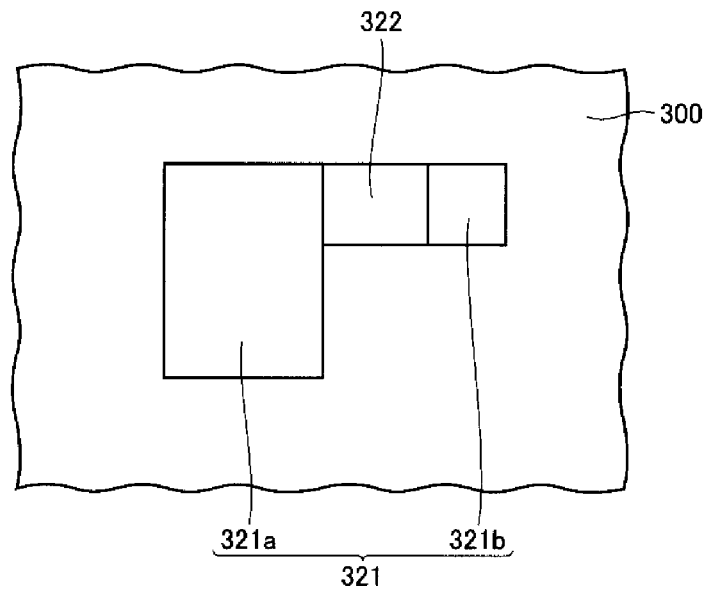
FIG. 26 is a partially enlarged plan view of the collective board according to Preferred Embodiment 4 of the present invention.

A portion corresponding to one rigid-flexible multilayer wiring board included in the collective board 301 is shown in an enlarged manner in FIG. 26. In this portion, a rigid portion forming region 321 and a flexible portion forming region 322 can be identified. The other portion is a margin portion 300. The rigid portion forming region 321 is a set of a portion 321a and a portion 321b.

Figure 27:
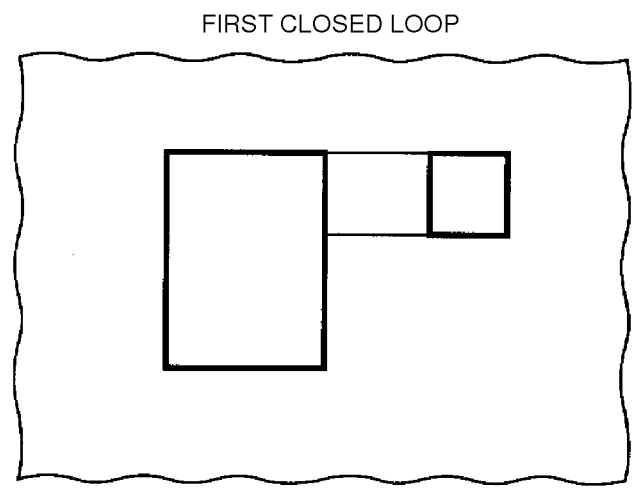
FIG. 27 is an explanatory diagram of a first closed loop shown in Preferred Embodiment 4 of the present invention.
Figure 28:
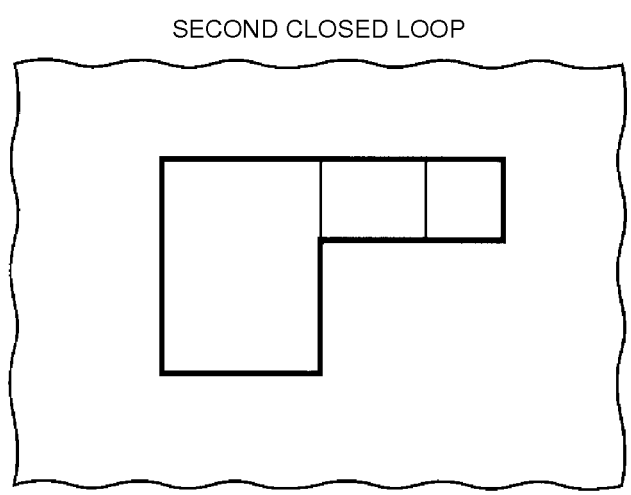
FIG. 28 is an explanatory diagram of a second closed loop shown in Preferred Embodiment 4 of the present invention.
Figure 29:
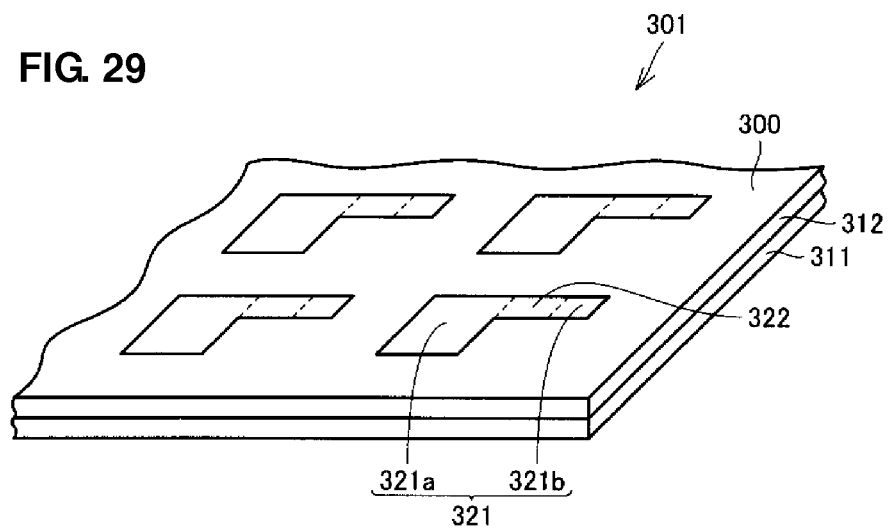
FIG. 29 is a partial perspective view of the collective board according to Preferred Embodiment 4 of the present invention.
Figure 30:
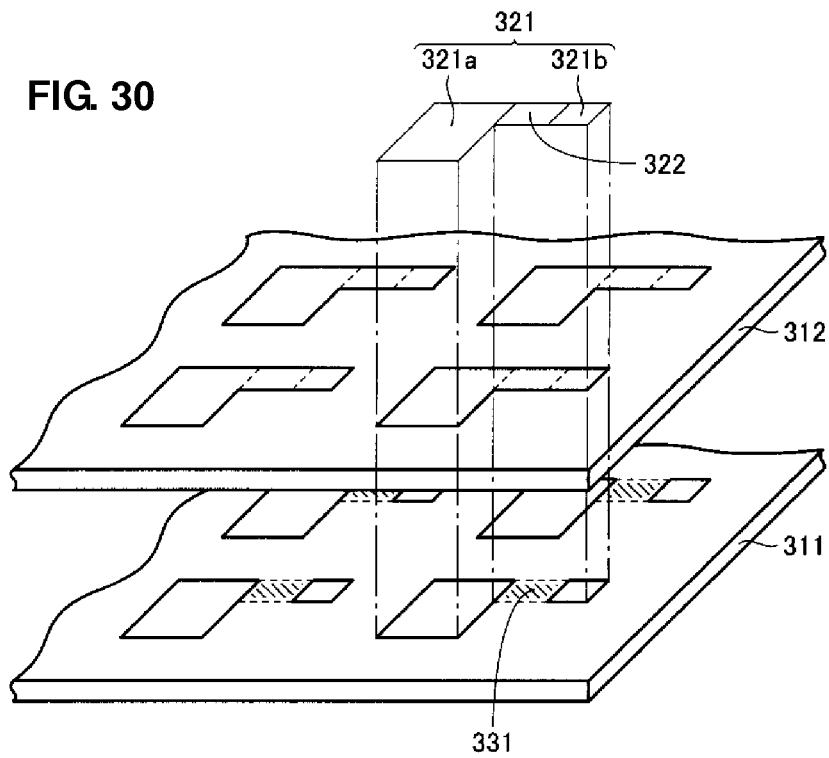
FIG. 30 is an exploded diagram of the collective board according to Preferred Embodiment 4 of the present invention.

Further, for convenience of the following explanation, first and second closed loops are defined. The "first closed loop" is an outline surrounding a rigid portion forming region, namely, a portion indicated by each thick line in FIG. 27. When there is a plurality of rigid portion forming regions, the first closed loop is a set of a plurality of loops as shown in FIG. 27. The "second closed loop" is an outline surrounding a rigid portion forming region and a flexible portion forming region, namely, a portion indicated by a thick line in FIG. 28. A partial perspective view of the collective board 301 is shown in FIG. 29. The collective board 301 preferably includes a two-layer structure in which first and second thermoplastic resin layers 311 and 312 are laminated in order from below. An exploded diagram in which the collective board 301 is divided into each resin layer is shown in FIG. 30. Of the upper surface of each layer shown in FIG. 30, a portion drawn by each solid line indicates a portion where a cut is present, and a portion drawn by each broken line indicates a portion where no cut is present.

The collective board 301 according to the present preferred embodiment is a collective board which includes a plurality of rigid-flexible multilayer wiring boards which can be taken out, and includes the first thermoplastic resin layer 311 including the rigid portion forming region 321 and the flexible portion forming region 322 adjacent to each other; the second thermoplastic resin layer 312 which is laminated on the upper surface of the first thermoplastic resin layer 311 and includes the rigid portion forming region 321 and the flexible portion forming region 322 adjacent to each other; and a first separation layer 331 which is formed on the flexible portion forming region 322 of the upper surface of the first thermoplastic resin layer 311 from a resin material having a higher melting point than those of thermoplastic resin materials included in the first and second thermoplastic resin layers 311 and 312. Where an outline surrounding the rigid portion forming region when seen in a plan view is referred to a first closed loop and an outline surrounding the flexible portion forming region and the rigid portion forming region together when seen in a plan view is referred to as a second closed loop, the first thermoplastic resin layer 311 has a cut along the first closed loop, and the second thermoplastic resin layer 312 has a cut along the second closed loop. The flexible portion forming region 322 of the second thermoplastic resin layer 312 is supported by the flexible portion forming region 322 of the first thermoplastic resin layer 311 via the first separation layer 331. By separating the flexible portion forming region 322 of the second thermoplastic resin layer 312 from the flexible portion forming region 322 of the first thermoplastic resin layer 311 on which the first separation layer 331 is formed, a region of the first thermoplastic resin layer 311 which is surrounded by the first closed loop and a region of the second thermoplastic resin layer 312 which is surrounded by the second closed loop can be taken out in an integrated manner.

Figure 31:
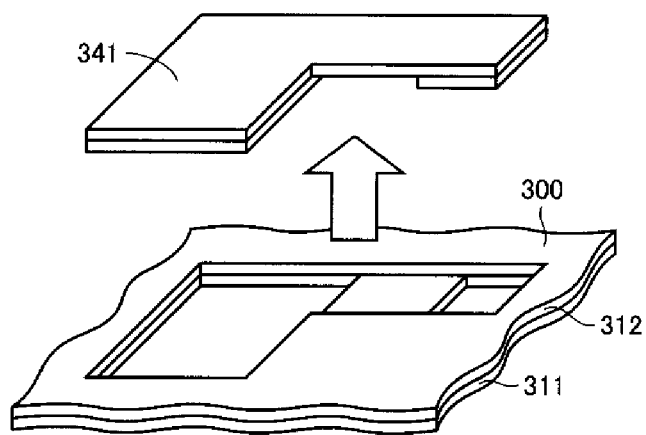
FIG. 31 is an explanatory diagram showing a situation where a rigid-flexible multilayer wiring board is taken out from the collective board according to Preferred Embodiment 4 of the present invention.

In other words, as shown in FIG. 31, a rigid-flexible multilayer wiring board 341 including a two-layer structure with a rigid portion and a flexible portion can be taken out in an integrated manner from the collective board 301. After being taken out, the margin portion 300 is left.

The first separation layer 331 may be provided on the flexible portion forming region 322 of the upper surface of the first thermoplastic resin layer 311 as described here (see FIG. 30), but instead may be provided on the flexible portion forming region 322 of the lower surface of the second thermoplastic resin layer 312.

When the collective board 301 is produced, the manufacturing method described in Preferred Embodiment 2 or 3 can be used.

According to the collective board according to the present preferred embodiment, a rigid-flexible multilayer wiring board desired as a product can easily be taken out by using the cut and the separation layer provided appropriately in each layer. In other words, the operation to remove the unnecessary portion for forming the flexible portion can be conducted easily and in a short time.

Preferred Embodiment 5

Figure 32:
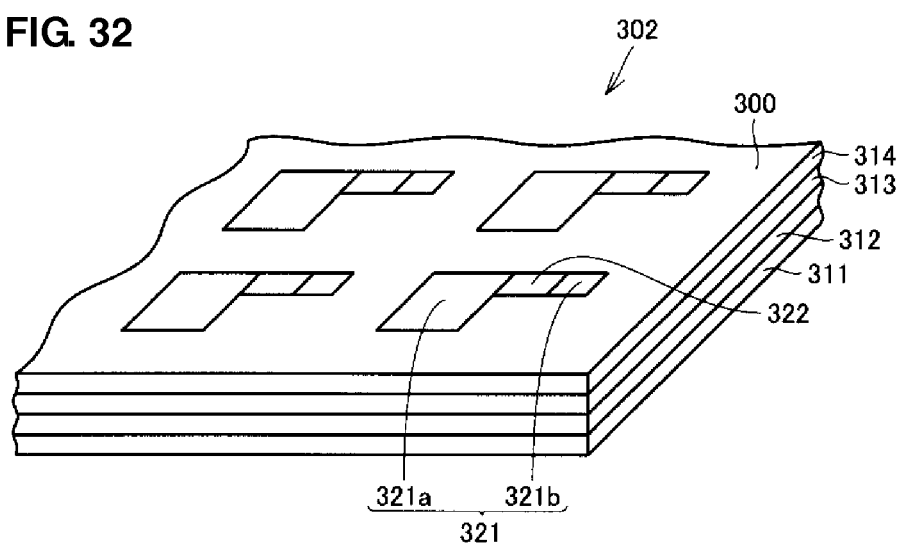
FIG. 32 is a partial perspective view of a collective board according to Preferred Embodiment 5 of the present invention.
Figure 33:
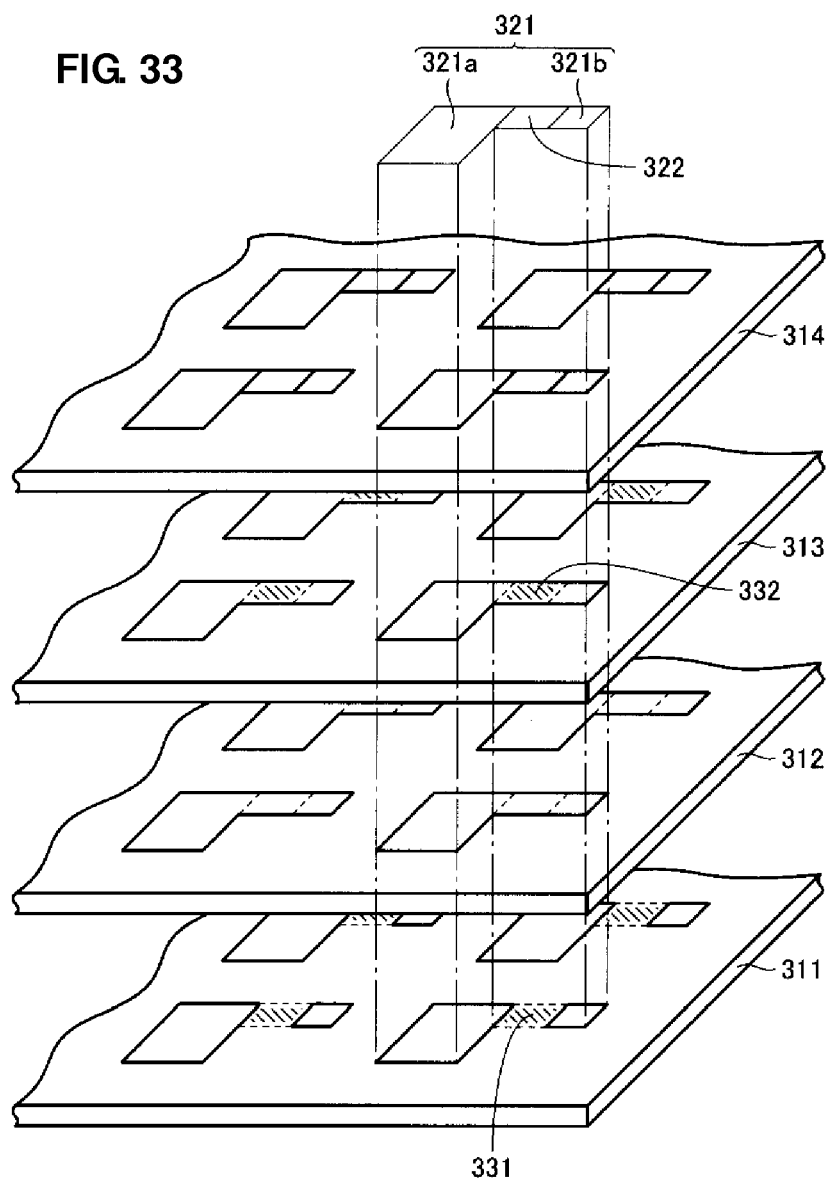
FIG. 33 is an exploded diagram of the collective board according to Preferred Embodiment 5 of the present invention.

A collective board according to Preferred Embodiment 5 of the present invention will be described with reference to FIGS. 32 to 34. A partial perspective view of the collective board is shown in FIG. 32. The collective board 302 includes a four-layer structure in which first to fourth thermoplastic resin layers 311, 312, 313, and 314 are laminated in order from below. An exploded diagram in which the collective board 302 is divided into each layer is shown in FIG. 33.

The collective board 302 preferably has the same basic structure of the collective board 301 described in Preferred Embodiment 4. Further, the third thermoplastic resin layer 313 is laminated on the upper surface of the second thermoplastic resin layer 312, and the fourth thermoplastic resin layer 314 is laminated on an upper surface of the third thermoplastic resin layer 313. The collective board 302 includes a second separation layer 332 which is formed on the flexible portion forming region 322 of the upper surface of the third thermoplastic resin layer 313 from a resin material having a higher melting point than those of thermoplastic resin materials included in the first to fourth thermoplastic resin layers 311, 312, 313, and 314. The third thermoplastic resin layer 313 has a cut of the same pattern as that of the second thermoplastic resin layer 312. The fourth thermoplastic resin layer 314 has a cut of the same pattern as that of the second thermoplastic resin layer 312 as well as a cut along the boundary between the rigid portion forming region 321 and the flexible portion forming region 322.

The second separation layer 332 may be provided on the flexible portion forming region 322 of the upper surface of the third thermoplastic resin layer 313 as described here, but instead may be provided on the flexible portion forming region 322 of a lower surface of the fourth thermoplastic resin layer 314.

Figure 34:
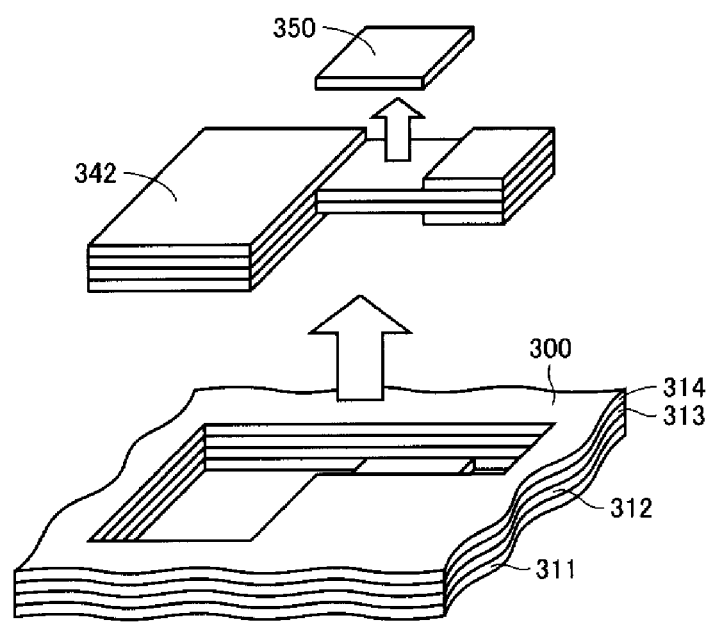
FIG. 34 is an explanatory diagram showing a situation where a rigid-flexible multilayer wiring board is taken out from the collective board according to Preferred Embodiment 5 of the present invention.

As shown in FIG. 34, a rigid-flexible multilayer wiring board 342 including a four-layer structure with a rigid portion and a flexible portion can be taken in an integrated manner from the collective board 302. At that time, an unnecessary portion 350 is already isolated by the cut and is merely placed on the rigid-flexible multilayer wiring board 342 via the second separation layer 332, and thus the unnecessary portion 350 can also easily be removed.

When the collective board 302 is produced, the manufacturing method described in Preferred Embodiments 2 or 3 can be used.

According to the collective board according to the present preferred embodiment, a rigid-flexible multilayer wiring board desired as a product can easily be taken out by using the cut and the separation layer provided appropriately in each layer. In other words, the operation to remove the unnecessary portion for forming the flexible portion can be conducted in a short time.

The preferred embodiments disclosed herein are illustrative and are not limiting. The scope of the present invention is defined by the claims, not by the above descriptions, and is intended to encompass all modifications within the equivalent meaning and scope with respect to the claims.

Various preferred embodiments of the present invention can be used for a method for manufacturing a rigid-flexible multilayer wiring board, for example.

What is claimed is:

1. A method for manufacturing a rigid-flexible multilayer wiring board, comprising:
    a step of forming a release layer from a resin material having a higher melting point than that of a material of a first thermoplastic resin sheet, such that the release layer covers a flexible portion forming region of a principal surface of the thermoplastic resin sheet;
    a step of conducting surface modification on the principal surface of the first thermoplastic resin sheet while using the release layer as a mask;
    a step of forming a first cut in the first thermoplastic resin sheet and the release layer such that the first cut separates the first thermoplastic resin sheet and the release layer entirely in a thickness direction along a portion of an outline of the release layer when seen in a plan view;
    a step of laminating a second thermoplastic resin sheet on the principal surface of the first thermoplastic resin sheet such that the second thermoplastic resin sheet covers the release layer to form a laminate including the first and second thermoplastic resin sheets;
    a step of press-bonding the laminate;
    a step of forming a second cut from at least either one of upper and lower surfaces of the laminate such that the first cut is combined with the second cut so as to form a closed loop shape to isolate a region of the first or second thermoplastic resin sheet that is face-to-face with the release layer; and a step of removing a portion of the first or second thermoplastic resin sheet which is isolated by isolation of the region of the first or second thermoplastic sheet.

2. A method for manufacturing a rigid-flexible multilayer wiring board, comprising:
- a step of conducting surface modification on a principal surface of a first thermoplastic resin sheet;
- a step of forming a release layer from a resin material having a higher melting point than that of a material of the first thermoplastic resin sheet such that the release layer covers a flexible portion forming region of the principal surface of the first thermoplastic resin sheet on which the surface modification is conducted;
- a step of forming a first cut in the first thermoplastic resin sheet and the release layer such that the first cut separates the first thermoplastic resin sheet and the release layer entirely in a thickness direction along a portion of an outline of the release layer when seen in a plan view;
- a step of laminating a second thermoplastic resin sheet on the principal surface of the first thermoplastic resin sheet such that the second thermoplastic resin sheet covers the release layer to form a laminate including the first and second thermoplastic resin sheets;
- a step of press-bonding the laminate;
- a step of forming a second cut from at least either one of upper and lower surfaces of the laminate such that the first cut is combined with the second cut so as to form a closed loop shape to isolate a region of the first or second thermoplastic resin sheet that is face-to-face with the release layer; and
- a step of removing a portion of the first or second thermoplastic resin sheet which is isolated by isolation of the region of the first or second thermoplastic sheet.

* * * * *